(12) United States Patent
Wang et al.

(10) Patent No.: US 10,297,201 B2
(45) Date of Patent: May 21, 2019

(54) COMPENSATION METHOD OF CATHODE VOLTAGE DROP OF ORGANIC LIGHT EMITTING DIODE DISPLAY DEVICE AND PIXEL DRIVING CIRCUIT

(71) Applicant: Shenzhen China Star Optoelectronics Semiconductor Display Technology Co., Ltd., Shenzhen (CN)

(72) Inventors: Zhenling Wang, Shenzhen (CN); Taijiun Hwang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 21 days.

(21) Appl. No.: 15/569,770

(22) PCT Filed: Jul. 13, 2017

(86) PCT No.: PCT/CN2017/092876
§ 371 (c)(1),
(2) Date: Oct. 27, 2017

(87) PCT Pub. No.: WO2018/214258
PCT Pub. Date: Nov. 29, 2018

(65) Prior Publication Data
US 2018/0342205 A1    Nov. 29, 2018

(30) Foreign Application Priority Data
May 26, 2017 (CN) .......................... 2017 1 0386467

(51) Int. Cl.
*G09G 3/3258* (2016.01)
*H01L 27/32* (2006.01)
*H01L 51/52* (2006.01)

(52) U.S. Cl.
CPC ....... *G09G 3/3258* (2013.01); *H01L 27/3276* (2013.01); *H01L 51/5206* (2013.01);
(Continued)

(58) Field of Classification Search
CPC ......... G09G 3/3258; G09G 2310/0264; G09G 2320/0233; H01L 27/3276; H01L 51/5206; H01L 51/5221
See application file for complete search history.

(56) References Cited

U.S. PATENT DOCUMENTS

| 7,893,625 B2 * | 2/2011 | Suh ...................... G09G 3/3225 |
| | | 315/160 |
| 2008/0001857 A1 * | 1/2008 | Yoo ...................... G09G 3/3233 |
| | | 345/76 |

(Continued)

FOREIGN PATENT DOCUMENTS

| CN | 101976546 A | 2/2011 |
| CN | 102971781 A | 3/2013 |

(Continued)

*Primary Examiner* — Nicholas J Lee
*Assistant Examiner* — Gerald L Oliver
(74) *Attorney, Agent, or Firm* — Leong C. Lei (57) ABSTRACT

Provided is a compensation method of a cathode voltage drop of an OLED display device and a pixel driving circuit. The first pixel driving circuits having function of detecting the cathode voltage are arranged in a portion of sub pixels of the OLED display device and uses the first pixel driving circuits to detect the cathode voltages of these sub pixels. The cathode voltages inputted to all the sub pixels of the OLED display device are obtained by interpolation according to the detected cathode voltages of these detecting sub pixels. Then, the cathode voltage compensation look up table is obtained according to the cathode voltages of all the sub pixels of the OLED display device. Finally, the data signal voltage is compensated with the cathode voltage compensation look up table. The data signal voltage after compensation is used to drive the OLED display device to perform image display.

13 Claims, 6 Drawing Sheets

(52) U.S. Cl.
CPC . *H01L 51/5221* (2013.01); *G09G 2300/0439* (2013.01); *G09G 2320/0233* (2013.01)

(56) References Cited

U.S. PATENT DOCUMENTS

| | | | |
|---|---|---|---|
| 2012/0249401 A1* | 10/2012 | Omoto | G06F 3/0412 345/80 |
| 2014/0132642 A1* | 5/2014 | Wu | G09G 3/3233 345/690 |
| 2014/0313242 A1* | 10/2014 | Kaplan | G09G 3/3208 345/694 |
| 2016/0041676 A1* | 2/2016 | Tan | G06F 3/0416 345/173 |
| 2016/0118457 A1* | 4/2016 | Kim | H01L 27/3279 257/40 |
| 2016/0190228 A1* | 6/2016 | Park | H01L 27/3279 257/40 |

FOREIGN PATENT DOCUMENTS

| | | | |
|---|---|---|---|
| CN | 103996374 A | 8/2014 | |
| CN | 104867455 A | 8/2015 | |
| CN | 106128359 A | 11/2016 | |
| KR | 20120040858 A | 4/2012 | |

\* cited by examiner

COMPENSATION METHOD OF CATHODE VOLTAGE DROP OF ORGANIC LIGHT EMITTING DIODE DISPLAY DEVICE AND PIXEL DRIVING CIRCUIT

FIELD OF THE INVENTION

The present invention relates to a display field, and more particularly to a compensation method of a cathode voltage drop of an organic light emitting diode display device and a pixel driving circuit.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types, which are the passive driving and the active driving, i.e. the direct addressing and the Thin Film Transistor (TFT) matrix addressing. The active driving is also called Active Matrix (AM) type. Each light-emitting element in the AMOLED is independently controlled by TFT addressing. The pixel driving circuit comprising the light-emitting element and the TFT addressing circuit requires the conductive line to load the OLED cathode voltage (OVSS) for driving.

With the progress of time and technology, the large scale, high resolution AMOLED display device has been gradually developed. Correspondingly, the large scale AMOLED display device requires panel of larger scale and pixels of more amounts. The length of the conductive line becomes longer and longer, and the electrical resistance becomes larger. Unavoidably, the cathode voltage will generate the IR Drop on the conductive line. The electrical resistance value of the conductive line makes that the cathode voltage obtained by each pixel driving circuit is different. Thus, with the same input of the data signal voltage, different pixels have different currents, brightness outputs to result in that the display brightness of the entire panel is nonuniform, and image is different.

Figure 1:
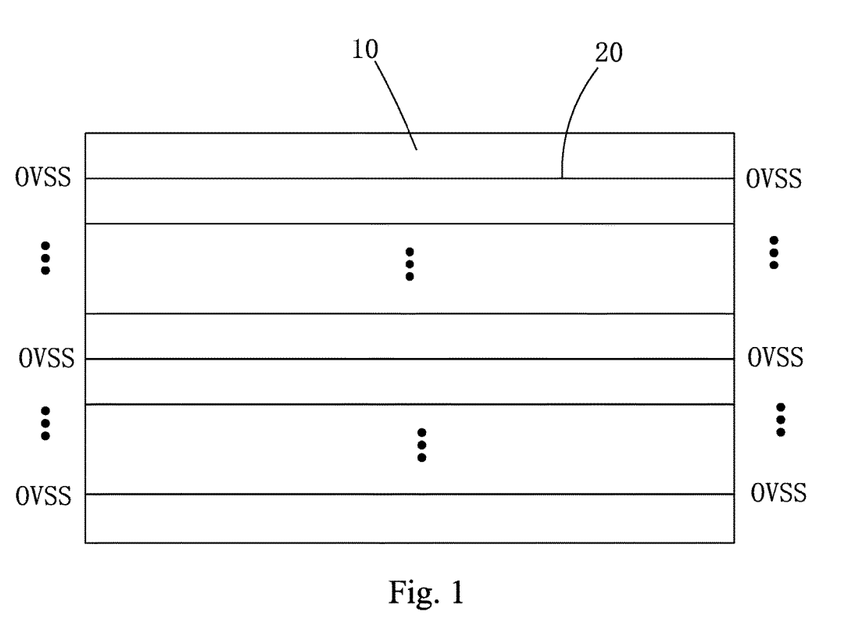
FIG. 1 is a diagram of an AMOLED display device according to prior art.

Specifically, referring to FIG. 1, the AMOLD display device according to prior art comprises: a substrate 10, a plurality of sub pixels arranged on the substrate 10 in array and a plurality of cathode voltage (OVSS) lines 20 which are in parallel spaced arrangement on the substrate 10, wherein each row of sub pixels is correspondingly coupled to one cathode voltage line 20 to be provided with the cathode voltage by the corresponding cathode voltage line 20. The cathode voltage is inputted to the cathode voltage line 20 from two ends of the cathode voltage line 20 at the borders of the substrate 10. Since the IR Drop due to the resistance of the cathode voltage line 20 will lead to that the actual voltage at the middle of the cathode voltage line 20 is smaller than the voltage inputted to the two ends of the cathode voltage line 20. Namely, the cathode voltage received by the sub pixels at the middle of the substrate 10 is smaller than the cathode voltage received by the sub pixels at two ends of the substrate 10, which ultimately results in the display brightness nonuniformity of the entire panel.

SUMMARY OF THE INVENTION

An objective of the present invention is to provide a compensation method of a cathode voltage drop of an organic light emitting diode display device, which can compensate the voltage drop of the cathode voltage (OVSS voltage) in an organic light emitting diode display device to promote the brightness uniformity of the organic light emitting diode display device.

Another objective of the present invention is to provide a pixel driving circuit, which can quickly and easily detect the cathode voltage (OVSS voltage).

For realizing the aforesaid objective, the present invention provides a compensation method of a cathode voltage drop of an organic light emitting diode display device, comprising steps of:

Step S1, providing the organic light emitting diode display device, comprising: a substrate, a plurality of sub pixels arranged on the substrate in array and a plurality of cathode voltage (OVSS) lines which are horizontal and in parallel spaced arrangement, wherein each row of sub pixels is correspondingly coupled to one cathode voltage line, at least one cathode voltage line of the plurality of cathode voltage lines is a detecting line, at least three sub pixels in the row of sub pixels correspondingly coupled to the detecting line are detecting sub pixels, which are respectively coupled to two end points and a middle point of the detecting line;

wherein the cathode voltage line inputs a cathode voltage (OVSS voltage) to each of the sub pixels, a first pixel driving circuit is provided in the detecting sub pixel to detect a magnitude of the cathode voltage inputted to the detecting sub pixel;

Step S2, acquiring a gray scale to be detected and detecting the magnitude of the cathode voltage inputted to each of the detecting sub pixels by the first pixel driving circuit, obtaining the magnitudes of the cathode voltages inputted to all the sub pixels by interpolation according to the magnitude of the cathode voltage inputted to each of the detecting sub pixels and obtaining a cathode voltage compensating look up table according to the magnitudes of the cathode voltages inputted to all the sub pixels;

Step S3, repeating Step S2 with a plurality of times until the cathode voltage compensating look up tables for all the gray scales of the organic light emitting diode display device is obtained;

Step S4, acquiring a data signal voltage to be displayed, compensating the data signal voltage to be displayed according to the data signal voltage to be displayed and the cathode voltage compensating look up table of the gray scale corresponding to the data signal voltage to be displayed and using the data signal voltage after compensation to drive the organic light emitting diode display device to perform image display.

The first pixel driving circuit comprises: a first thin film transistor, a second thin film transistor, a third thin film transistor, a fourth thin film transistor, a fifth thin film transistor, a first capacitor and a first organic light emitting diode;

wherein a gate of the first thin film transistor receives a scan signal, a source of the first thin film transistor receives a data signal, a drain of the first thin film transistor is coupled to a first node; a gate of the second thin film transistor is coupled to the first node, a drain of the second thin film transistor receives a power source voltage, a source of the second thin film transistor is coupled to a second node; a gate of the third thin film transistor receives a first control signal, a source of the third thin film transistor is coupled to the second node, a drain of the third thin film transistor is coupled to a third node; a gate of the fourth thin film transistor receives a detection control signal, a source of the fourth thin film transistor is coupled to the third node, a drain of the fourth thin film transistor is coupled to a detecting chip; a gate of the fifth thin film transistor receives a second control signal, a source of the fifth thin film transistor is coupled to a cathode of the first organic light emitting diode, a drain of the fifth thin film transistor is coupled to the third node; one end of the first capacitor is coupled to the first node, the other end of the first capacitor is coupled to the drain of the second thin film transistor; an anode of the first organic light emitting diode is coupled to the second node and the cathode of the first organic light emitting diode is coupled to the cathode voltage line (OVSS line) corresponding to the sub pixel where the first pixel driving circuit is located.

A second pixel driving circuit is provided in each of the plurality of sub pixels except the detecting sub pixels, the second pixel driving circuit comprises: a sixth thin film transistor, a seventh thin film transistor, an eighth thin film transistor, a second capacitor and a second organic light emitting diode;

a gate of the sixth thin film transistor receives a scan signal, a source of the sixth thin film transistor receives a data signal, a drain of the sixth thin film transistor is coupled to a gate of the seventh thin film transistor; a drain of the seventh thin film transistor receives a power source voltage, a source of the seventh thin film transistor is coupled to an anode of the second organic light emitting diode; a gate of the eighth thin film transistor receives a detection control signal, a source of the eighth thin film transistor is coupled to the anode of the second organic light emitting diode, a drain of the eighth thin film transistor is coupled to a detecting chip; one end of the second capacitor is coupled to the gate of the seventh thin film transistor, the other end of the second capacitor is coupled to the drain of the seventh thin film transistor; a cathode of the second organic light emitting diode is coupled to the cathode voltage line (OVSS line) corresponding to the sub pixel where the second pixel driving circuit is located.

A step of acquiring a gray scale to be detected and detecting the magnitude of the cathode voltage inputted to each of the detecting sub pixels by the first pixel driving circuit in Step S2 comprises: first, all of the scan signal, the first control signal and the detection control signal providing high level voltages, the second control signal providing a low level voltage, the first thin film transistor, the third thin film transistor and the fourth thin film transistor being activated, the fifth thin film transistor being deactivated, the first node being written with a detecting data signal voltage corresponding to the gray scale to be detected, the second node being written with a reference voltage; then, both the scan signal and the first control signal providing low level voltages, the detection control signal and the second control signal providing high level voltages, the first thin film transistor and the third thin film transistor being deactivated, the fourth thin film transistor and the fifth thin film transistor being activated, a voltage difference value between the gate and the source of the second thin film transistor remaining unchanged, the detecting chip detecting the cathode voltage.

The substrate comprises: a first detection area, a second detection area and a third detection area sequentially arranged in a vertical direction.

One cathode voltage line of the plurality of cathode voltage lines is the detecting line and the detecting line is in the second detection area of the substrate.

Three cathode voltage lines of the plurality of cathode voltage lines are the detecting lines and the three detecting lines are respectively in the first detection area, the second detection area and the third detection area of the substrate.

In Step S4, the second control signal controls the fifth thin film transistor to be off as the organic light emitting diode performs image display.

The present invention further provides a pixel driving circuit, comprising: a first thin film transistor, a second thin film transistor, a third thin film transistor, a fourth thin film transistor, a fifth thin film transistor, a first capacitor and a first organic light emitting diode;

wherein a gate of the first thin film transistor receives a scan signal, a source of the first thin film transistor receives a data signal, a drain of the first thin film transistor is coupled to a first node; a gate of the second thin film transistor is coupled to the first node, a drain of the second thin film transistor receives a power source voltage, a source of the second thin film transistor is coupled to a second node; a gate of the third thin film transistor receives a first control signal, a source of the third thin film transistor is coupled to the second node, a drain of the third thin film transistor is coupled to a third node; a gate of the fourth thin film transistor receives a detection control signal, a source of the fourth thin film transistor is coupled to the third node, a drain of the fourth thin film transistor is coupled to a detecting chip; a gate of the fifth thin film transistor receives a second control signal, a source of the fifth thin film transistor is coupled to a cathode of the first organic light emitting diode, a drain of the fifth thin film transistor is coupled to the third node; one end of the first capacitor is coupled to the first node, the other end of the first capacitor is coupled to the drain of the second thin film transistor; an anode of the first organic light emitting diode is coupled to the second node and the cathode of the first organic light emitting diode receives a cathode voltage (OVSS voltage).

The present invention further provides a compensation method of a cathode voltage drop of an organic light emitting diode display device, comprising steps of:

Step S1, providing the organic light emitting diode display device, comprising: a substrate, a plurality of sub pixels arranged on the substrate in array and a plurality of cathode voltage (OVSS) lines which are horizontal and in parallel spaced arrangement, wherein each row of sub pixels is correspondingly coupled to one cathode voltage line, at least one cathode voltage line of the plurality of cathode voltage lines is a detecting line, at least three sub pixels in the row of sub pixels correspondingly coupled to the detecting line are detecting sub pixels, which are respectively coupled to two end points and a middle point of the detecting line;

wherein the cathode voltage line inputs a cathode voltage (OVSS voltage) to each of the sub pixels, a first pixel driving circuit is provided in the detecting sub pixel to detect a magnitude of the cathode voltage inputted to the detecting sub pixel;

Step S2, acquiring a gray scale to be detected and detecting the magnitude of the cathode voltage inputted to each of the detecting sub pixels by the first pixel driving circuit, obtaining the magnitudes of the cathode voltages inputted to all the sub pixels by interpolation according to the magnitude of the cathode voltage inputted to each of the detecting sub pixels and obtaining a cathode voltage compensating look up table according to the magnitudes of the cathode voltages inputted to all the sub pixels;

Step S3, repeating Step S2 with a plurality of times until the cathode voltage compensating look up tables for all the gray scales of the organic light emitting diode display device is obtained;

Step S4, acquiring a data signal voltage to be displayed, compensating the data signal voltage to be displayed according to the data signal voltage to be displayed and the cathode voltage compensating look up table of the gray scale corresponding to the data signal voltage to be displayed and using the data signal voltage after compensation to drive the organic light emitting diode display device to perform image display;

wherein the first pixel driving circuit, comprising: a first thin film transistor, a second thin film transistor, a third thin film transistor, a fourth thin film transistor, a fifth thin film transistor, a first capacitor and a first organic light emitting diode;

wherein a gate of the first thin film transistor receives a scan signal, a source of the first thin film transistor receives a data signal, a drain of the first thin film transistor is coupled to a first node; a gate of the second thin film transistor is coupled to the first node, a drain of the second thin film transistor receives a power source voltage, a source of the second thin film transistor is coupled to a second node; a gate of the third thin film transistor receives a first control signal, a source of the third thin film transistor is coupled to the second node, a drain of the third thin film transistor is coupled to a third node; a gate of the fourth thin film transistor receives a detection control signal, a source of the fourth thin film transistor is coupled to the third node, a drain of the fourth thin film transistor is coupled to a detecting chip; a gate of the fifth thin film transistor receives a second control signal, a source of the fifth thin film transistor is coupled to a cathode of the first organic light emitting diode, a drain of the fifth thin film transistor is coupled to the third node; one end of the first capacitor is coupled to the first node, the other end of the first capacitor is coupled to the drain of the second thin film transistor; an anode of the first organic light emitting diode is coupled to the second node and the cathode of the first organic light emitting diode is coupled to the cathode voltage line (OVSS line) corresponding to the sub pixel where the first pixel driving circuit is located;

wherein a step of acquiring a gray scale to be detected and detecting the magnitude of the cathode voltage inputted to each of the detecting sub pixels by the first pixel driving circuit in Step S2 comprises: first, all of the scan signal, the first control signal and the detection control signal providing high level voltages, the second control signal providing a low level voltage, the first thin film transistor, the third thin film transistor and the fourth thin film transistor being activated, the fifth thin film transistor being deactivated, the first node being written with a detecting data signal voltage corresponding to the gray scale to be detected, the second node being written with a reference voltage; then, both the scan signal and the first control signal providing low level voltages, the detection control signal and the second control signal providing high level voltages, the first thin film transistor and the third thin film transistor being deactivated, the fourth thin film transistor and the fifth thin film transistor being activated, a voltage difference value between the gate and the source of the second thin film transistor remaining unchanged, the detecting chip detecting the cathode voltage;

wherein the substrate comprises: a first detection area, a second detection area and a third detection area sequentially arranged in a vertical direction;

wherein in Step S4, the second control signal controls the fifth thin film transistor to be off as the organic light emitting diode performs image display.

The benefits of the present invention are: the present invention provides a compensation method of a cathode voltage drop of an organic light emitting diode display device. The compensation method arranges the first pixel driving circuits having a function of detecting the cathode voltage in a portion of sub pixels of the OLED display device and uses the first pixel driving circuits to detect the cathode voltages of these sub pixels. The cathode voltages inputted to all the sub pixels of the OLED display device are obtained by interpolation according to the detected cathode voltages of these detecting sub pixels. Then, the cathode voltage compensation look up table is obtained according to the cathode voltages of all the sub pixels of the OLED display device. Finally, the data signal voltage is compensated with the cathode voltage compensation look up table. The data signal voltage after compensation is used to drive the OLED display device to perform image display, which can effectively compensate the voltage drop of the cathode voltage in the OLED display device to promote the brightness uniformity of the OLED display device. The present invention further provides a pixel driving circuit, which can quickly and easily detect the cathode voltage (OVSS voltage).

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 2:
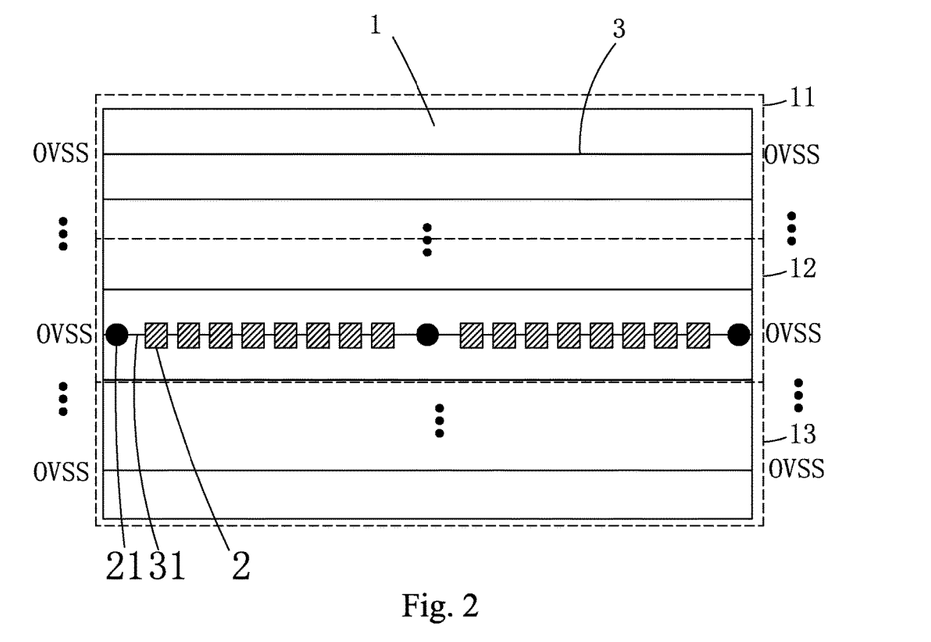
FIG. 2 is a diagram of Step S1 in a compensation method of a cathode voltage drop of an organic light emitting diode display device according to the present invention.
Figure 6:
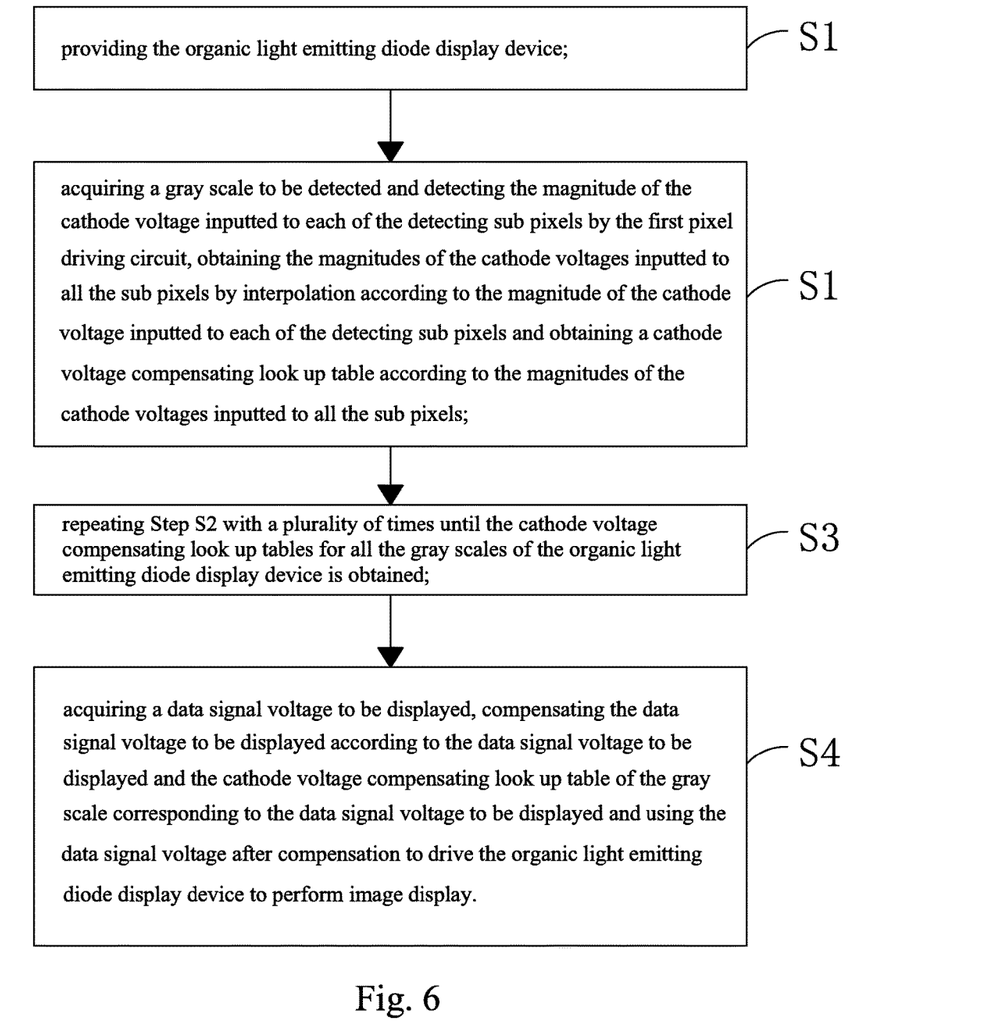
FIG. 6 is a flowchart of a compensation method of a cathode voltage drop of an organic light emitting diode display device according to the present invention.

Please refer to FIG. 6. The present invention provides a compensation method of a cathode voltage drop of an organic light emitting diode display device, comprising steps of:

Step S1, referring to FIG. 2, providing the organic light emitting diode display device, comprising: a substrate 1, a plurality of sub pixels 2 arranged on the substrate 1 in array and a plurality of cathode voltage (OVSS) lines 3 which are horizontal and in parallel spaced arrangement on the substrate 1, wherein each row of sub pixels 2 is correspondingly coupled to one cathode voltage line 3, at least one cathode voltage line 3 of the plurality of cathode voltage lines 3 is a detecting line 31, at least three sub pixels 2 in the row of sub pixels 2 correspondingly coupled to the detecting line 31 are detecting sub pixels 21, which are respectively coupled to two end points and a middle point of the detecting line 31;

wherein the cathode voltage line 3 inputs a cathode voltage (OVSS voltage) to each of the sub pixels 2, a first pixel driving circuit 210 is provided in the detecting sub pixel 21 to detect a magnitude of the cathode voltage inputted to the detecting sub pixel 21.

Figure 3:
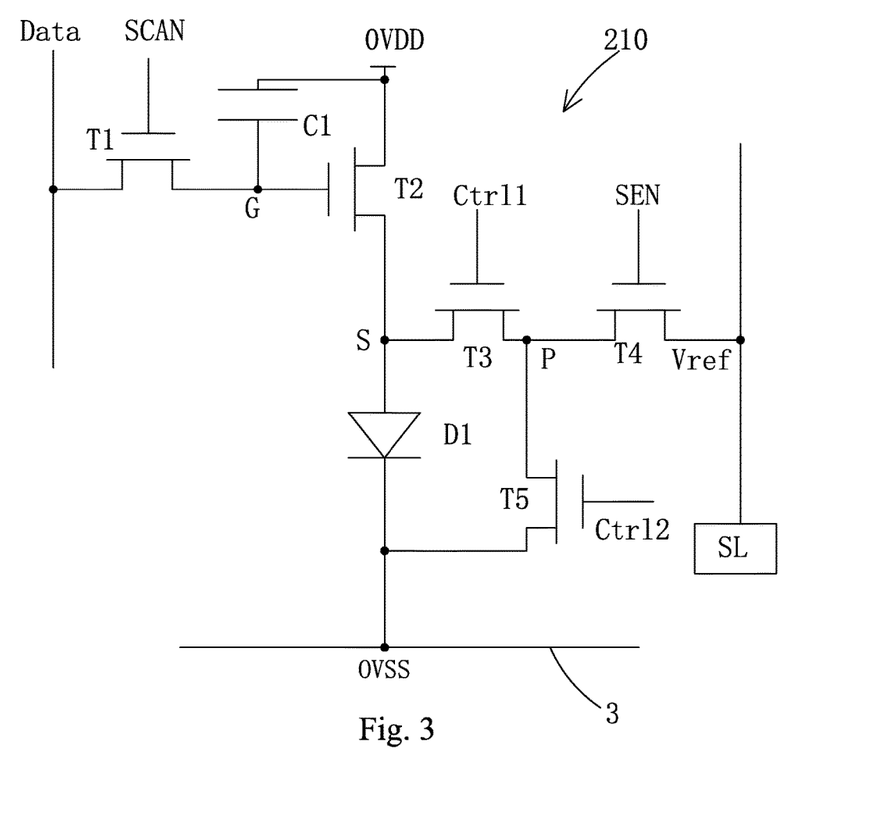
FIG. 3 is a circuit diagram of a first pixel driving circuit in a compensation method of a cathode voltage drop of an organic light emitting diode display device according to the present invention and a circuit diagram of a pixel driving circuit according to the present invention.

Specifically, referring to FIG. 3, the first pixel driving circuit 210 comprises: a first thin film transistor T1, a second thin film transistor T2, a third thin film transistor T3, a fourth thin film transistor T4, a fifth thin film transistor T5, a first capacitor C1 and a first organic light emitting diode D1;

wherein a gate of the first thin film transistor T1 receives a scan signal SCAN, a source of the first thin film transistor T1 receives a data signal Data, a drain of the first thin film transistor T1 is coupled to a first node G; a gate of the second thin film transistor T2 is coupled to the first node G, a drain of the second thin film transistor T2 receives a power source voltage OVDD, a source of the second thin film transistor T2 is coupled to a second node S; a gate of the third thin film transistor T3 receives a first control signal Ctrl1, a source of the third thin film transistor T3 is coupled to the second node S, a drain of the third thin film transistor T3 is coupled to a third node P; a gate of the fourth thin film transistor T4 receives a detection control signal SEN, a source of the fourth thin film transistor T4 is coupled to the third node P, a drain of the fourth thin film transistor T4 is coupled to a detecting chip SL; a gate of the fifth thin film transistor T5 receives a second control signal Ctrl2, a source of the fifth thin film transistor T5 is coupled to a cathode of the first organic light emitting diode D1, a drain of the fifth thin film transistor T5 is coupled to the third node P; one end of the first capacitor C1 is coupled to the first node G, the other end of the first capacitor C1 is coupled to the drain of the second thin film transistor T2; an anode of the first organic light emitting diode is coupled to the second node S and the cathode of the first organic light emitting diode D1 is coupled to the cathode voltage line 3 (OVSS line) corresponding to the sub pixel 2 where the first pixel driving circuit 210 is located.

Figure 4:
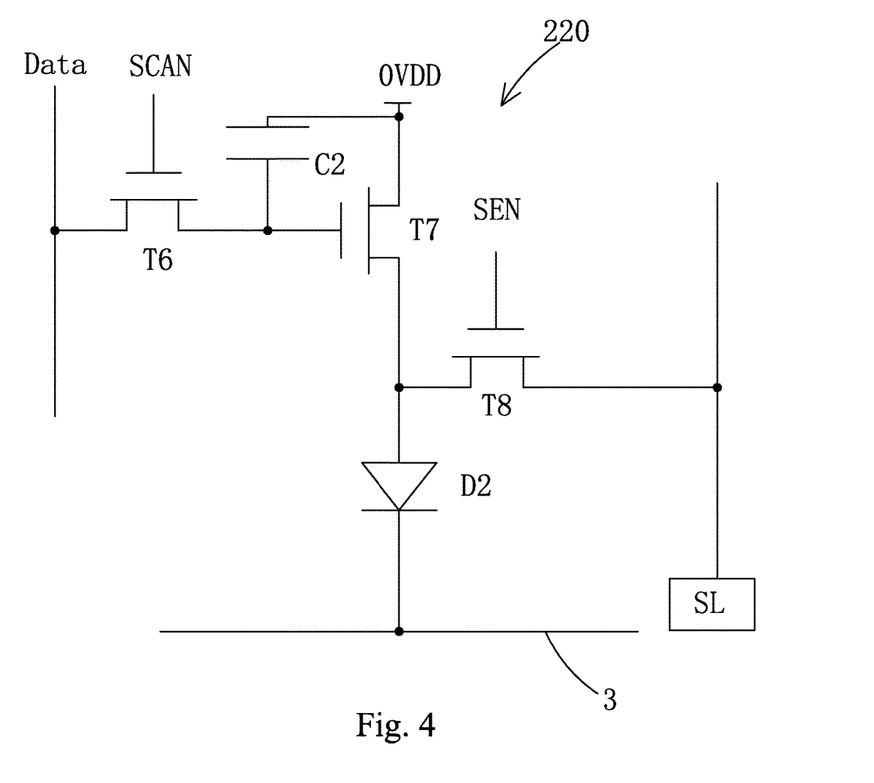
FIG. 4 is a circuit diagram of a second pixel driving circuit in a compensation method of a cathode voltage drop of an organic light emitting diode display device according to the present invention.

Please refer to FIG. 4. a second pixel driving circuit 220 is provided in each of the plurality of sub pixels 2 except the detecting sub pixels 21, the second pixel driving circuit 220 comprises: a sixth thin film transistor T6, a seventh thin film transistor T7, an eighth thin film transistor T8, a second capacitor C2 and a second organic light emitting diode D2;

a gate of the sixth thin film transistor T6 receives a scan signal SCAN, a source of the sixth thin film transistor T6 receives a data signal Data, a drain of the sixth thin film transistor T6 is coupled to a gate of the seventh thin film transistor T7; a drain of the seventh thin film transistor T7 receives a power source voltage OVDD, a source of the seventh thin film transistor T7 is coupled to an anode of the second organic light emitting diode D2; a gate of the eighth thin film transistor T8 receives a detection control signal SEN, a source of the eighth thin film transistor T8 is coupled to the anode of the second organic light emitting diode D2, a drain of the eighth thin film transistor T8 is coupled to a detecting chip SL; one end of the second capacitor C2 is coupled to the gate of the seventh thin film transistor T7, the other end of the second capacitor C2 is coupled to the drain of the seventh thin film transistor T7; a cathode of the second organic light emitting diode D2 is coupled to the cathode voltage line 3 (OVSS line) corresponding to the sub pixel 2 where the second pixel driving circuit 220 is located.

Specifically, as shown in FIG. 2, the substrate 1 comprises: a first detection area 11, a second detection area 12 and a third detection area 13 sequentially arranged in a vertical direction. Each of the first detection area 11, the second detection area 12 and the third detection area 13 comprises a plurality of cathode voltage lines 3. Preferably, widths of the first detection area 11, the second detection area 12 and the third detection area 13 are equal in the vertical direction.

Optionally, one cathode voltage line 3 of the plurality of cathode voltage lines 3 is the detecting line 31 and the detecting line 31 is in the second detection area 12 of the substrate 1. Preferably, the detecting line 31 is a cathode voltage line 3 near a horizontal central line of the second detection area 12.

Optionally, three cathode voltage lines 3 of the plurality of cathode voltage lines 3 are the detecting lines 31 and the three detecting lines 31 are respectively in the first detection area 11, the second detection area 12 and the third detection area 13 of the substrate 1. Preferably, the three detecting lines 31 respectively are a cathode voltage line 3 at a top of the substrate 1, a cathode voltage line 3 near a horizontal central line of the substrate 1 and a cathode voltage line 3 at a bottom of the substrate 1.

Furthermore, except the three detecting sub pixels 21 coupled to the two end points and the middle point of the detecting line 31, more detecting sub pixels 21 can be added on each of the detecting lines 31 on demand. Namely, the pixel driving circuits of more detecting sub pixels 21 are replaced with the first pixel driving circuits 210 to promote the precision of cathode voltages inputted to all the sub pixels 2, which are obtained by interpolation.

Step S2, acquiring a gray scale to be detected and detecting the magnitude of the cathode voltage inputted to each of the detecting sub pixels 21 by the first pixel driving circuit 210, obtaining the magnitudes of the cathode voltages inputted to all the sub pixels 2 by interpolation according to the magnitude of the cathode voltage inputted to each of the detecting sub pixels 21 and obtaining a cathode voltage compensating look up table according to the magnitudes of the cathode voltages inputted to all the sub pixels 2.

Figure 5:
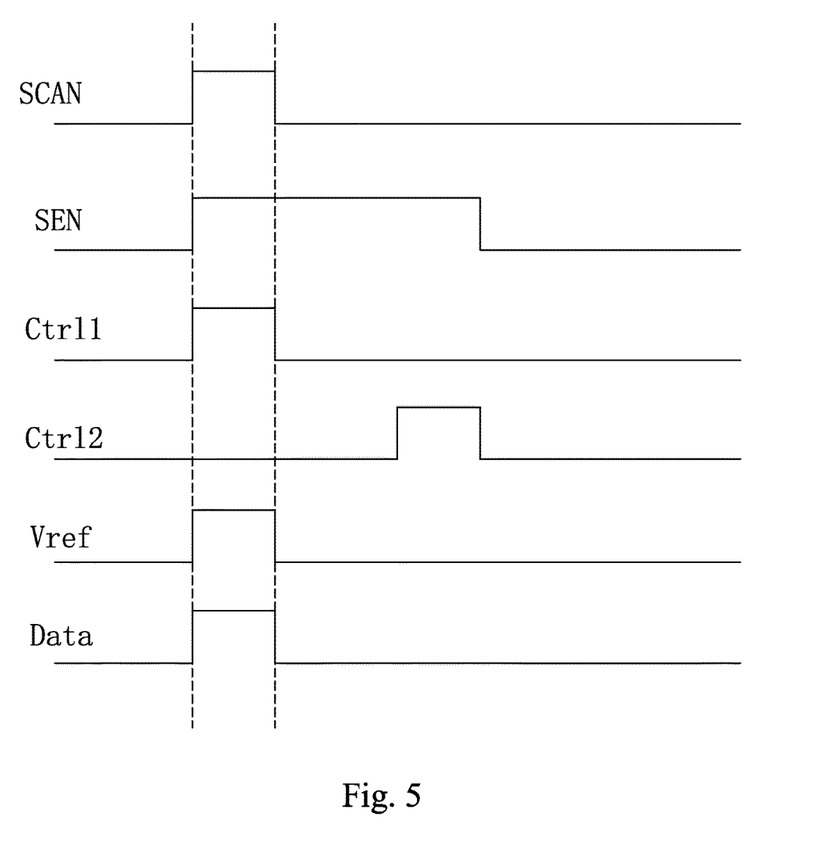
FIG. 5 is a working waveform diagram of a pixel driving circuit shown in FIG. 3.

Specifically, referring to FIG. 5 in conjunction with FIG. 3, a step of acquiring a gray scale to be detected and detecting the magnitude of the cathode voltage inputted to each of the detecting sub pixels 21 by the first pixel driving circuit 210 in Step S2 comprises: first, all of the scan signal SCAN, the first control signal Ctrl1 and the detection control signal SEN providing high level voltages, the second control signal Ctrl2 providing a low level voltage, the first thin film transistor T1, the third thin film transistor T3 and the fourth thin film transistor T4 being activated, the fifth thin film transistor T5 being deactivated, the first node G being written with a detecting data signal voltage corresponding to the gray scale to be detected, the second node being written with a reference voltage Vref; then, both the scan signal SCAN and the first control signal Ctrl1 providing low level voltages, the detection control signal SEN and the second control signal Ctrl2 providing high level voltages, the first thin film transistor T1 and the third thin film transistor T3 being deactivated, the fourth thin film transistor T4 and the fifth thin film transistor T5 being activated, a voltage difference value between the gate and the source of the second thin film transistor T2 remaining unchanged, the detecting chip SL detecting the cathode voltage.

Step S3, repeating Step S2 with a plurality of times until the cathode voltage compensating look up tables for all the gray scales of the organic light emitting diode display device is obtained;

Step S4, acquiring a data signal voltage to be displayed, compensating the data signal voltage to be displayed according to the data signal voltage to be displayed and the cathode voltage compensating look up table of the gray scale corresponding to the data signal voltage to be displayed and using the data signal voltage after compensation to drive the organic light emitting diode display device to perform image display.

In Step S4, the second control signal Ctrl2 controls the fifth thin film transistor T5 to be off as the organic light emitting diode performs image display.

The aforesaid compensation method of the cathode voltage drop of the OLED display device arranges the first pixel driving circuits having a function of detecting the cathode voltage in a portion of sub pixels of the OLED display device and uses the first pixel driving circuits to detect the cathode voltages of these sub pixels. The cathode voltages inputted to all the sub pixels of the OLED display device are obtained by interpolation according to the detected cathode voltages of these detecting sub pixels. Then, the cathode voltage compensation look up table is obtained according to the cathode voltages of all the sub pixels of the OLED display device. Finally, the data signal voltage is compensated with the cathode voltage compensation look up table. The data signal voltage after compensation is used to drive the OLED display device to perform image display, which can effectively compensate the voltage drop of the cathode voltage in the OLED display device to promote the brightness uniformity of the OLED display device.

Please refer to FIG. 3, the present invention further provides a first pixel driving circuit, comprising: a first thin film transistor T1, a second thin film transistor T2, a third thin film transistor T3, a fourth thin film transistor T4, a fifth thin film transistor T5, a first capacitor C1 and a first organic light emitting diode D1;

wherein a gate of the first thin film transistor T1 receives a scan signal SCAN, a source of the first thin film transistor T1 receives a data signal Data, a drain of the first thin film transistor T1 is coupled to a first node G; a gate of the second thin film transistor T2 is coupled to the first node G, a drain of the second thin film transistor T2 receives a power source voltage OVDD, a source of the second thin film transistor T2 is coupled to a second node S; a gate of the third thin film transistor T3 receives a first control signal Ctrl1, a source of the third thin film transistor T3 is coupled to the second node S, a drain of the third thin film transistor T3 is coupled to a third node P; a gate of the fourth thin film transistor T4 receives a detection control signal SEN, a source of the fourth thin film transistor T4 is coupled to the third node P, a drain of the fourth thin film transistor T4 is coupled to a detecting chip SL; a gate of the fifth thin film transistor T5 receives a second control signal Ctrl2, a source of the fifth thin film transistor T5 is coupled to a cathode of the first organic light emitting diode D1, a drain of the fifth thin film transistor T5 is coupled to the third node P; one end of the first capacitor C1 is coupled to the first node G, the other end of the first capacitor C1 is coupled to the drain of the second thin film transistor T2; an anode of the first organic light emitting diode is coupled to the second node S and the cathode of the first organic light emitting diode D1 receives the cathode voltage (OVSS voltage).

Specifically, the pixel driving circuit is the first pixel driving circuit 210 arranged in the detecting sub pixel 21 according to the aforesaid compensation method of the cathode voltage drop of the OLED display device. The working procedure is consistent as the step of detecting the magnitude of the cathode voltage inputted to each of the detecting sub pixels 21 by the first pixel driving circuit 210 in Step S2 of the aforesaid compensation method of the cathode voltage drop of the OLED display device. The repeated description is omitted here.

The aforesaid pixel driving circuit can quickly and easily detect the cathode voltage (OVSS voltage) and can be applied for compensating the cathode voltage drop of the OLED display device.

In conclusion, the present invention provides a compensation method of a cathode voltage drop of an organic light emitting diode display device. The compensation method arranges the first pixel driving circuits having a function of detecting the cathode voltage in a portion of sub pixels of the OLED display device and uses the first pixel driving circuits to detect the cathode voltages of these sub pixels. The cathode voltages inputted to all the sub pixels of the OLED display device are obtained by interpolation according to the detected cathode voltages of these detecting sub pixels. Then, the cathode voltage compensation look up table is obtained according to the cathode voltages of all the sub pixels of the OLED display device. Finally, the data signal voltage is compensated with the cathode voltage compensation look up table. The data signal voltage after compensation is used to drive the OLED display device to perform image display, which can effectively compensate the voltage drop of the cathode voltage in the OLED display device to promote the brightness uniformity of the OLED display device. The present invention further provides a pixel driving circuit, which can quickly and easily detect the cathode voltage (OVSS voltage).

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A compensation method of a cathode voltage drop of an organic light emitting diode display device, comprising steps of:

Step S1, providing the organic light emitting diode display device, comprising: a substrate, a plurality of sub pixels arranged on the substrate in array and a plurality of cathode voltage (OVSS) lines which are horizontal and in parallel spaced arrangement, wherein each row of sub pixels is correspondingly coupled to one cathode voltage line, at least one cathode voltage line of the plurality of cathode voltage lines is a detecting line, at least three sub pixels in the row of sub pixels correspondingly coupled to the detecting line are detecting sub pixels, which are respectively coupled to two end points and a middle point of the detecting line;

wherein the cathode voltage line inputs a cathode voltage (OVSS voltage) to each of the sub pixels, a first pixel driving circuit is provided in the detecting sub pixel to detect a magnitude of the cathode voltage inputted to the detecting sub pixel;

Step S2, acquiring a gray scale to be detected and detecting the magnitude of the cathode voltage inputted to each of the detecting sub pixels by the first pixel driving circuit, obtaining the magnitudes of the cathode voltages inputted to all the sub pixels by interpolation according to the magnitude of the cathode voltage inputted to each of the detecting sub pixels and obtaining a cathode voltage compensating look up table according to the magnitudes of the cathode voltages inputted to all the sub pixels;

Step S3, repeating Step S2 with a plurality of times until the cathode voltage compensating look up tables for all the gray scales of the organic light emitting diode display device is obtained;

Step S4, acquiring a data signal voltage to be displayed, compensating the data signal voltage to be displayed according to the data signal voltage to be displayed and the cathode voltage compensating look up table of the gray scale corresponding to the data signal voltage to be displayed and using the data signal voltage after compensation to drive the organic light emitting diode display device to perform image display.

2. The compensation method of the cathode voltage drop of the organic light emitting diode display device according to claim 1, wherein the first pixel driving circuit comprises: a first thin film transistor, a second thin film transistor, a third thin film transistor, a fourth thin film transistor, a fifth thin film transistor, a first capacitor and a first organic light emitting diode;

wherein a gate of the first thin film transistor receives a scan signal, a source of the first thin film transistor receives a data signal, a drain of the first thin film transistor is coupled to a first node; a gate of the second thin film transistor is coupled to the first node, a drain of the second thin film transistor receives a power source voltage, a source of the second thin film transistor is coupled to a second node; a gate of the third thin film transistor receives a first control signal, a source of the third thin film transistor is coupled to the second node, a drain of the third thin film transistor is coupled to a third node; a gate of the fourth thin film transistor receives a detection control signal, a source of the fourth thin film transistor is coupled to the third node, a drain of the fourth thin film transistor is coupled to a detecting chip; a gate of the fifth thin film transistor receives a second control signal, a source of the fifth thin film transistor is coupled to a cathode of the first organic light emitting diode, a drain of the fifth thin film transistor is coupled to the third node; one end of the first capacitor is coupled to the first node, the other end of the first capacitor is coupled to the drain of the second thin film transistor; an anode of the first organic light emitting diode is coupled to the second node and the cathode of the first organic light emitting diode is coupled to the cathode voltage line (OVSS line) corresponding to the sub pixel where the first pixel driving circuit is located.

3. The compensation method of the cathode voltage drop of the organic light emitting diode display device according to claim 2, wherein a step of acquiring a gray scale to be detected and detecting the magnitude of the cathode voltage inputted to each of the detecting sub pixels by the first pixel driving circuit in Step S2 comprises:

first, all of the scan signal, the first control signal and the detection control signal providing high level voltages, the second control signal providing a low level voltage, the first thin film transistor, the third thin film transistor and the fourth thin film transistor being activated, the fifth thin film transistor being deactivated, the first node being written with a detecting data signal voltage corresponding to the gray scale to be detected, the second node being written with a reference voltage; then, both the scan signal and the first control signal providing low level voltages, the detection control signal and the second control signal providing high level voltages, the first thin film transistor and the third thin film transistor being deactivated, the fourth thin film transistor and the fifth thin film transistor being activated, a voltage difference value between the gate and the source of the second thin film transistor remaining unchanged, the detecting chip detecting the cathode voltage.

4. The compensation method of the cathode voltage drop of the organic light emitting diode display device according to claim 2, wherein in Step S4, the second control signal controls the fifth thin film transistor to be off as the organic light emitting diode performs image display.

5. The compensation method of the cathode voltage drop of the organic light emitting diode display device according to claim 1, wherein a second pixel driving circuit is provided in each of the plurality of sub pixels except the detecting sub pixels, the second pixel driving circuit comprises: a sixth thin film transistor, a seventh thin film transistor, an eighth thin film transistor, a second capacitor and a second organic light emitting diode;

a gate of the sixth thin film transistor receives a scan signal, a source of the sixth thin film transistor receives a data signal, a drain of the sixth thin film transistor is coupled to a gate of the seventh thin film transistor; a drain of the seventh thin film transistor receives a power source voltage, a source of the seventh thin film transistor is coupled to an anode of the second organic light emitting diode; a gate of the eighth thin film transistor receives a detection control signal, a source of the eighth thin film transistor is coupled to the anode of the second organic light emitting diode, a drain of the eighth thin film transistor is coupled to a detecting chip; one end of the second capacitor is coupled to the gate of the seventh thin film transistor, the other end of the second capacitor is coupled to the drain of the seventh thin film transistor; a cathode of the second organic light emitting diode is coupled to the cathode voltage line (OVSS line) corresponding to the sub pixel where the second pixel driving circuit is located.

6. The compensation method of the cathode voltage drop of the organic light emitting diode display device according to claim 1, wherein the substrate comprises:
a first detection area, a second detection area and a third detection area sequentially arranged in a vertical direction.

7. The compensation method of the cathode voltage drop of the organic light emitting diode display device according to claim 6, wherein one cathode voltage line of the plurality of cathode voltage lines is the detecting line and the detecting line is in the second detection area of the substrate.

8. The compensation method of the cathode voltage drop of the organic light emitting diode display device according to claim 6, wherein three cathode voltage lines of the plurality of cathode voltage lines are the detecting lines and the three detecting lines are respectively in the first detection area, the second detection area and the third detection area of the substrate.

9. A pixel driving circuit, comprising: a first thin film transistor, a second thin film transistor, a third thin film transistor, a fourth thin film transistor, a fifth thin film transistor, a first capacitor and a first organic light emitting diode;

wherein a gate of the first thin film transistor receives a scan signal, a source of the first thin film transistor receives a data signal, a drain of the first thin film transistor is coupled to a first node; a gate of the second thin film transistor is coupled to the first node, a drain of the second thin film transistor receives a power source voltage, a source of the second thin film transistor is coupled to a second node; a gate of the third thin film transistor receives a first control signal, a source of the third thin film transistor is coupled to the second node, a drain of the third thin film transistor is coupled to a third node; a gate of the fourth thin film transistor receives a detection control signal, a source of the fourth thin film transistor is coupled to the third node, a drain of the fourth thin film transistor is coupled to a detecting chip; a gate of the fifth thin film transistor receives a second control signal, a source of the fifth thin film transistor is coupled to a cathode of the first organic light emitting diode, a drain of the fifth thin film transistor is coupled to the third node; one end of the first capacitor is coupled to the first node, the other end of the first capacitor is coupled to the drain of the second thin film transistor; an anode of the first organic light emitting diode is coupled to the second node and the cathode of the first organic light emitting diode receives a cathode voltage (OVSS voltage).

10. A compensation method of a cathode voltage drop of an organic light emitting diode display device, comprising steps of:

Step S1, providing the organic light emitting diode display device, comprising: a substrate, a plurality of sub pixels arranged on the substrate in array and a plurality of cathode voltage (OVSS) lines which are horizontal and in parallel spaced arrangement, wherein each row of sub pixels is correspondingly coupled to one cathode voltage line, at least one cathode voltage line of the plurality of cathode voltage lines is a detecting line, at least three sub pixels in the row of sub pixels correspondingly coupled to the detecting line are detecting sub pixels, which are respectively coupled to two end points and a middle point of the detecting line;

wherein the cathode voltage line inputs a cathode voltage (OVSS voltage) to each of the sub pixels, a first pixel driving circuit is provided in the detecting sub pixel to detect a magnitude of the cathode voltage inputted to the detecting sub pixel;

Step S2, acquiring a gray scale to be detected and detecting the magnitude of the cathode voltage inputted to each of the detecting sub pixels by the first pixel driving circuit, obtaining the magnitudes of the cathode voltages inputted to all the sub pixels by interpolation according to the magnitude of the cathode voltage inputted to each of the detecting sub pixels and obtaining a cathode voltage compensating look up table according to the magnitudes of the cathode voltages inputted to all the sub pixels;

Step S3, repeating Step S2 with a plurality of times until the cathode voltage compensating look up tables for all the gray scales of the organic light emitting diode display device is obtained;

Step S4, acquiring a data signal voltage to be displayed, compensating the data signal voltage to be displayed according to the data signal voltage to be displayed and the cathode voltage compensating look up table of the gray scale corresponding to the data signal voltage to be displayed and using the data signal voltage after compensation to drive the organic light emitting diode display device to perform image display;

wherein the first pixel driving circuit, comprising: a first thin film transistor, a second thin film transistor, a third thin film transistor, a fourth thin film transistor, a fifth thin film transistor, a first capacitor and a first organic light emitting diode;

wherein a gate of the first thin film transistor receives a scan signal, a source of the first thin film transistor receives a data signal, a drain of the first thin film transistor is coupled to a first node; a gate of the second thin film transistor is coupled to the first node, a drain of the second thin film transistor receives a power source voltage, a source of the second thin film transistor is coupled to a second node; a gate of the third thin film transistor receives a first control signal, a source of the third thin film transistor is coupled to the second node, a drain of the third thin film transistor is coupled to a third node; a gate of the fourth thin film transistor receives a detection control signal, a source of the fourth thin film transistor is coupled to the third node, a drain of the fourth thin film transistor is coupled to a detecting chip; a gate of the fifth thin film transistor receives a second control signal, a source of the fifth thin film transistor is coupled to a cathode of the first organic light emitting diode, a drain of the fifth thin film transistor is coupled to the third node; one end of the first capacitor is coupled to the first node, the other end of the first capacitor is coupled to the drain of the second thin film transistor; an anode of the first organic light emitting diode is coupled to the second node and the cathode of the first organic light emitting diode is coupled to the cathode voltage line (OVSS line) corresponding to the sub pixel where the first pixel driving circuit is located;

wherein a step of acquiring a gray scale to be detected and detecting the magnitude of the cathode voltage inputted to each of the detecting sub pixels by the first pixel driving circuit in Step S2 comprises: first, all of the scan signal, the first control signal and the detection control signal providing high level voltages, the second control signal providing a low level voltage, the first thin film transistor, the third thin film transistor and the fourth thin film transistor being activated, the fifth thin film transistor being deactivated, the first node being written with a detecting data signal voltage corresponding to the gray scale to be detected, the second node being written with a reference voltage; then, both the scan signal and the first control signal providing low level voltages, the detection control signal and the second control signal providing high level voltages, the first thin film transistor and the third thin film transistor being deactivated, the fourth thin film transistor and the fifth thin film transistor being activated, a voltage difference value between the gate and the source of the second thin film transistor remaining unchanged, the detecting chip detecting the cathode voltage;

wherein the substrate comprises: a first detection area, a second detection area and a third detection area sequentially arranged in a vertical direction;

wherein in Step S4, the second control signal controls the fifth thin film transistor to be off as the organic light emitting diode performs image display.

11. The compensation method of the cathode voltage drop of the organic light emitting diode display device according to claim 10, wherein a second pixel driving circuit is provided in each of the plurality of sub pixels except the detecting sub pixels, the second pixel driving circuit comprises: a sixth thin film transistor, a seventh thin film transistor, an eighth thin film transistor, a second capacitor and a second organic light emitting diode;

a gate of the sixth thin film transistor receives a scan signal, a source of the sixth thin film transistor receives a data signal, a drain of the sixth thin film transistor is coupled to a gate of the seventh thin film transistor; a drain of the seventh thin film transistor receives a power source voltage, a source of the seventh thin film transistor is coupled to an anode of the second organic light emitting diode; a gate of the eighth thin film transistor receives a detection control signal, a source of the eighth thin film transistor is coupled to the anode of the second organic light emitting diode, a drain of the eighth thin film transistor is coupled to a detecting chip; one end of the second capacitor is coupled to the gate of the seventh thin film transistor, the other end of the second capacitor is coupled to the drain of the seventh thin film transistor; a cathode of the second organic light emitting diode is coupled to the cathode voltage line (OVSS line) corresponding to the sub pixel where the second pixel driving circuit is located.

12. The compensation method of the cathode voltage drop of the organic light emitting diode display device according to claim 10, wherein one cathode voltage line of the plurality of cathode voltage lines is the detecting line and the detecting line is in the second detection area of the substrate.

13. The compensation method of the cathode voltage drop of the organic light emitting diode display device according to claim 10, wherein three cathode voltage lines of the plurality of cathode voltage lines are the detecting lines and the three detecting lines are respectively in the first detection area, the second detection area and the third detection area of the substrate.

* * * * *